United States Patent
Kumakura et al.

(10) Patent No.: US 7,067,923 B2
(45) Date of Patent: Jun. 27, 2006

(54) SEMICONDUCTOR DEVICE HAVING HALL-EFFECT AND MANUFACTURING METHOD THEREOF

(75) Inventors: Hiromichi Kumakura, Saitama (JP); Hirokazu Goto, Saitama (JP); Takasi Kato, Saitama (JP)

(73) Assignee: Sanken Electric Co., Ltd. (JP)

(*) Notice: Subject to any disclaimer, the term of this patent is extended or adjusted under 35 U.S.C. 154(b) by 0 days.

(21) Appl. No.: 10/726,392

(22) Filed: Dec. 2, 2003

(65) Prior Publication Data

US 2004/0110367 A1  Jun. 10, 2004

(30) Foreign Application Priority Data

Dec. 3, 2002  (JP)  ............................. 2002-351740

(51) Int. Cl.
*H01L 23/52* (2006.01)
(52) U.S. Cl. .................... 257/760; 257/637; 257/642; 257/734; 257/753; 257/759; 257/E29.019; 257/E29.02
(58) Field of Classification Search ................ 257/637, 257/642, 734, 753, 759, 760, E29.019, E29.02
See application file for complete search history.

(56) References Cited

U.S. PATENT DOCUMENTS

| | | | | |
|---|---|---|---|---|
| 5,010,389 A | * | 4/1991 | Gansauge et al. | .......... 257/737 |
| 6,197,696 B1 | * | 3/2001 | Aoi | ............................. 438/700 |
| 6,559,548 B1 | * | 5/2003 | Matsunaga et al. | ......... 257/774 |
| 6,657,310 B1 | * | 12/2003 | Lin | ............................. 257/778 |

FOREIGN PATENT DOCUMENTS

| JP | 2001177115 A | * | 6/2001 |
|---|---|---|---|
| JP | 2001-230467 A | | 8/2001 |

* cited by examiner

*Primary Examiner*—Kenneth Parker
*Assistant Examiner*—Matthew E. Warren
(74) *Attorney, Agent, or Firm*—Townsend and Townsend and Crew

(57) ABSTRACT

A first insulation film is made of a silicon material and is provided on a semiconductor base. A second insulation film is made of an organic material and is provided on the first insulation film. The second insulation film is thicker than the first insulation film. A third insulation film is thinner than the second insulation film and is provided on the second insulation film. The third insulation film is made of a silicon material and has a moisture resistance property. A fourth insulation film is made of an organic material. The fourth insulation film is provided on the third insulation film to prevent a damage on the third insulation film. A wiring layer is provided on the fourth insulation film.

15 Claims, 9 Drawing Sheets

SEMICONDUCTOR DEVICE HAVING HALL-EFFECT AND MANUFACTURING METHOD THEREOF

BACKGROUND OF THE INVENTION

1. Field of the Invention

The present invention relates to a semiconductor device and a manufacturing method thereof.

2. Description of the Related Art

A conventional semiconductor device for current detection use including a Hall element is disclosed in, for example, Unexamined Japanese Patent Application KOKAI Publication No. 2001-230467.

FIG. 1 is a diagram showing the structure of a conventional semiconductor device 101. As shown in FIG. 1, the semiconductor device 101 comprises a semiconductor base 103 in which a Hall element 102 is formed, and a plate-like wiring layer 104 which is so provided as to surround the Hall element 102 as viewed from the top.

The wiring layer 104 is connected to an unillustrated measurement target circuit to constitute a path for a measurement target current. By a current flowing through the wiring layer 104, a magnetic field is formed around the wiring layer 104. The Hall element 102 detects the magnetic field formed around the wiring layer 104 by utilizing the Hall effect.

The wiring layer 104 is constituted by a U shape portion 105 which partly surrounds the Hall element 102, and pad portions 107 to which wires 106 to be connected to the measurement target circuit are connected as viewed from the top. A current from the measurement target circuit is supplied via the wires 106 to the pad portion 107 on one side, flows through the U shape portion 105 to reach the pad portion 107 on the other side, and returns via the wires 106 to the measurement target circuit Due to the current flowing through the U shape portion 105, a stable and relatively strong magnetic field is applied to the Hall element 102 arranged inside the U shape portion 105. The Hall element 102 is used to detect a magnetic field applied thereto, to detect whether there flows any current, or to measure the level of a current, by utilizing the Hall effect.

The wiring layer 104 is formed on the semiconductor base 103 via an insulation film. Generally, an insulation film having a sufficient thickness is necessary in order to ensure a sufficient withstand voltage. In many cases, an insulation film is made of a silicon material such as silicon dioxide, etc. However, it is difficult to make an insulation film made of a silicon material thick. To deal with this problem, there has been developed a method of stacking upon the silicon film, an organic film which is easy to make thick, such as a resin film made of polyimide resin.

FIG. 2 shows a sectional view of the semiconductor device 101 comprising such an organic film. FIG. 2 shows a sectional view of the semiconductor device 101 as sectioned along a line B—B shown in FIG. 1. As shown in FIG. 2, a thick organic film 108 is formed on a thin silicon oxide film 109 formed on the semiconductor base 103. The wiring layer 104 is formed on the organic layer 108 and is therefore electrically insulated from the semiconductor base 103 by the organic film 108 and the silicon oxide film 109. By forming the thick organic film 108, a sufficiently high withstand voltage can be ensured. Also by forming the thick organic film 108, it is possible to flatten the surface on which the wiring layer 104 is formed and to realize a strong bonding strength.

In the above-described semiconductor device 101, the wiring layer 104 is directly formed on the organic film 108. The wiring layer 104 is made of metal such as copper, etc. Generally, metal and an organic material can not adhere to each other strongly, which means that the organic film 108 and the wiring layer 104 are easily separated from each other. Therefore, the wiring layer 104 might be separated from the organic film 108 in a wire bonding process or in a heating process. Accordingly, there is a problem that the above-described structure can not achieve a semiconductor device having a high reliability.

The content of the above-mentioned Unexamined Japanese Patent Application KOKAI Publication No. 2001-230467 is incorporated herein by reference.

SUMMARY OF THE INVENTION

Accordingly, it is an object of the present invention to provide a semiconductor device having a high reliability and a manufacturing method thereof.

To achieve the above object, a semiconductor device according to a first aspect of the present invention comprises: a semiconductor base; a first insulation film which is provided on the semiconductor base and is made of a silicon material; a second insulation film which is provided on the first insulation film, is made of an organic material, and is thicker than the first insulation film; a third insulation film which is provided on the second insulation film, is made of a silicon material, and is thinner than the second insulation film; and a wiring layer which is provided on said third insulation film, wherein a current flows between the wiring layer and an external terminal.

The semiconductor device may further comprise a fourth insulation film which is provided between said third insulation film and said wiring layer so as to cover an entire surface of said third insulation film, and is made of an organic material.

The semiconductor device may further comprise a fifth insulation film which is provided between the fourth insulation film and the wiring layer and is made of a silicon material.

The fifth insulation film may have a top view shape same as that of the wiring layer.

The fourth insulation film may be made of polybenzoxazole resin.

The wiring layer may be made of metal.

The wiring layer may constitute a metal pad which is connected to the external terminal, and/or a metal wire through which the current flows via the metal pad.

A manufacturing method of a semiconductor device according to a second aspect of the present invention comprises: a step of forming a first insulation film made of a silicon material on a semiconductor base; a step of forming a second insulation film made of an organic material and thicker than the first insulation film on the first insulation film; a step of forming a third insulation film made of a silicon material and thinner than the second insulation film on the second insulation film; and a step of forming a wiring layer on the third insulation film, wherein a current flows between the wiring layer and an external terminal.

The manufacturing method may further comprise a step of forming a fourth insulation film made of an organic material and thinner than the third insulation film between the third insulation film and the wiring layer so as to cover an entire surface of the third insulation film.

The step of forming the wiring layer may include a step of forming a seed layer serving as a seed for growing a metal layer by a plating process, on the fourth insulation film; a step of forming a resist film on areas of the seed layer on which the wiring layer is not to be formed; a step of growing the metal layer by a plating process on areas of the seed layer that are not covered with the resist film; and a step of removing the resist film, and the seed layer beneath the resist film by etching.

The manufacturing method may further comprise a step of forming a fifth insulation film made of a silicon material between the fourth insulation film and the wiring layer.

The step of forming the fourth insulation film may include a step of making the fourth insulation film of polybenzoxazole resin.

The wiring layer may constitute a metal pad which is connected to the external terminal, and/or a metal wire through which the current flows via the metal pad.

A semiconductor device according to a third aspect of the present invention comprises: a semiconductor base; a first insulation film which is provided on the semiconductor base; a second insulation film which is provided on the first insulation film and is thicker than the first insulation film; a third insulation film which is provided on the second insulation film and is made of a material having a moisture resistance property; and a wiring layer which is provided on the third insulation film, wherein a current flows between the wiring layer and an external terminal.

The semiconductor device may further comprise a fourth insulation film which is provided between the third insulation film and the wiring layer so as to cover an entire surface of the third insulation film in order to prevent the third insulation film from being damaged.

The semiconductor device may further comprise a fifth insulation film which is provided between the fourth insulation film and the wiring layer to function as an adhesive layer for preventing separation of the wiring layer.

The fifth insulation film may have a top view shape same as that of the wiring layer.

The fourth insulation film may function as an adhesive layer for preventing separation of the wiring layer.

The fourth insulation film may be made of polybenzoxazole resin.

The wiring layer may be made of metal.

The wiring layer may constitute a metal pad which is connected to the external terminal, and/or a metal wire through which the current flows via the metal pad.

A manufacturing method of a semiconductor device according to a fourth aspect of the present invention comprises: a step of forming a first insulation film on a semiconductor base; a step of forming a second insulation film thicker than the first insulation film on the first insulation film; a step of forming a third insulation film made of a material having a moisture resistance property on the second insulation film; and a step of forming a wiring layer on the third insulation film, wherein a current flows between the wiring layer and an external terminal.

The manufacturing method may further comprise a step of forming a fourth insulation film for preventing a damage on the third insulation film between the third insulation film and the wiring layer so as to cover an entire surface of the third insulation film.

The step of forming the wiring layer may include: a step of forming a seed layer to serve as a seed for growing a metal layer by a plating process, on the fourth insulation film; a step of forming a resist film on areas of the seed layer on which the wiring layer is not to be formed; a step of growing the metal layer by a plating process on areas of the seed layer that are not covered with the resist film; and a step of removing the resist film and the seed layer beneath the resist film by etching while protecting the third insulation film by the fourth insulation film.

The manufacturing method may further comprise a step of forming a fifth insulation film to function as an adhesive layer for preventing separation of the wiring layer, between the fourth insulation film and the wiring layer.

The step of forming the fourth insulation film may include a step of forming an insulation film which functions as an adhesive layer for preventing separation of the wiring layer, as the fourth insulation film.

The step of forming the fourth insulation film may include a step of making the fourth insulation film of polybenzoxazole resin.

The wiring layer may constitute a metal pad which is connected to the external terminal, and/or a metal wire through which the current flows via the metal pad.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENT

Figure 1:
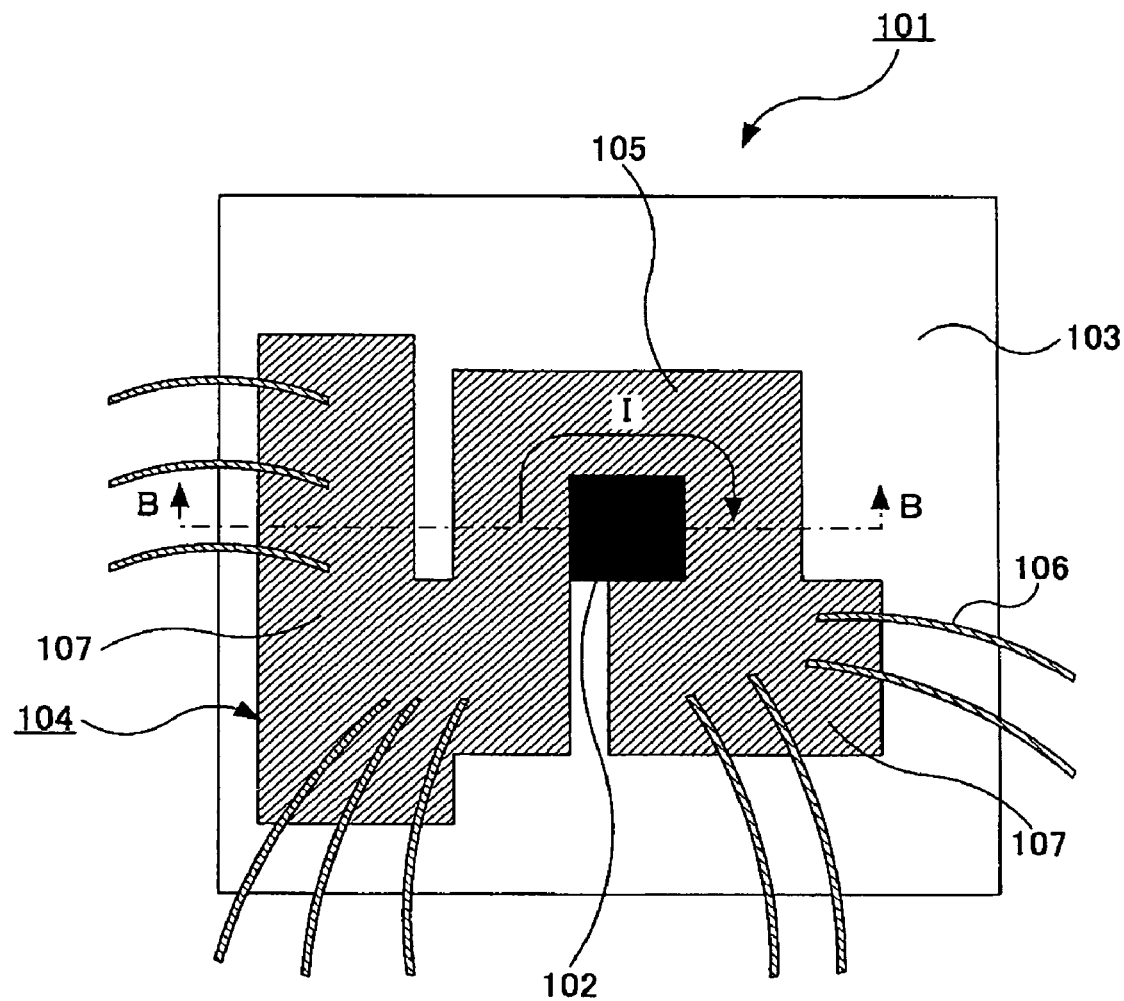
FIG. 1 is a top view of a conventional semiconductor device.
Figure 2:
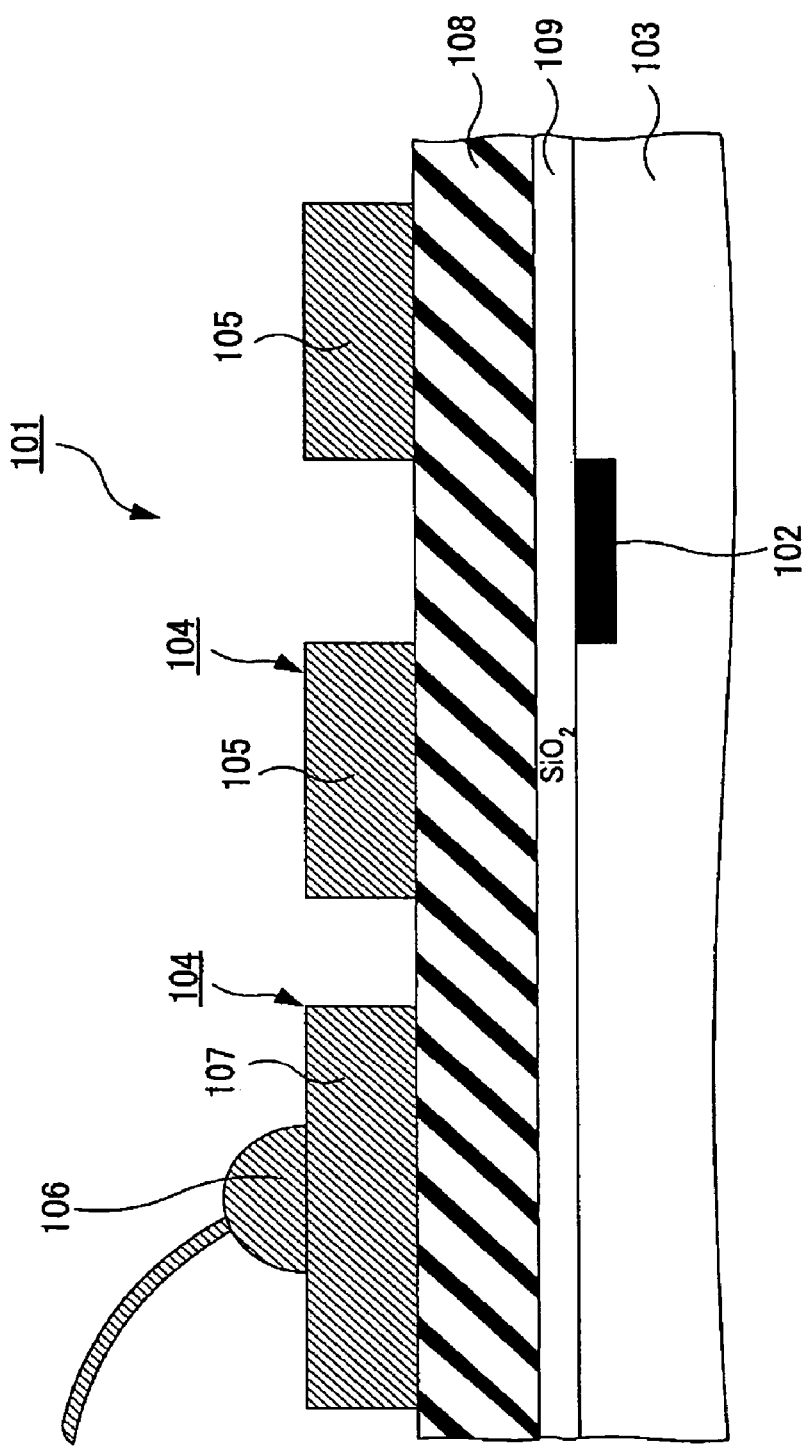
FIG. 2 is a sectional view of the semiconductor device shown in FIG. 1.

In order to prevent separation of the wiring layer 104 and the organic film 108 in the conventional semiconductor device 101 shown in FIG. 1 and FIG. 2, it is conceivable that an adhesive layer be formed between the wiring layer 104 and the organic film 108.

Figure 3:
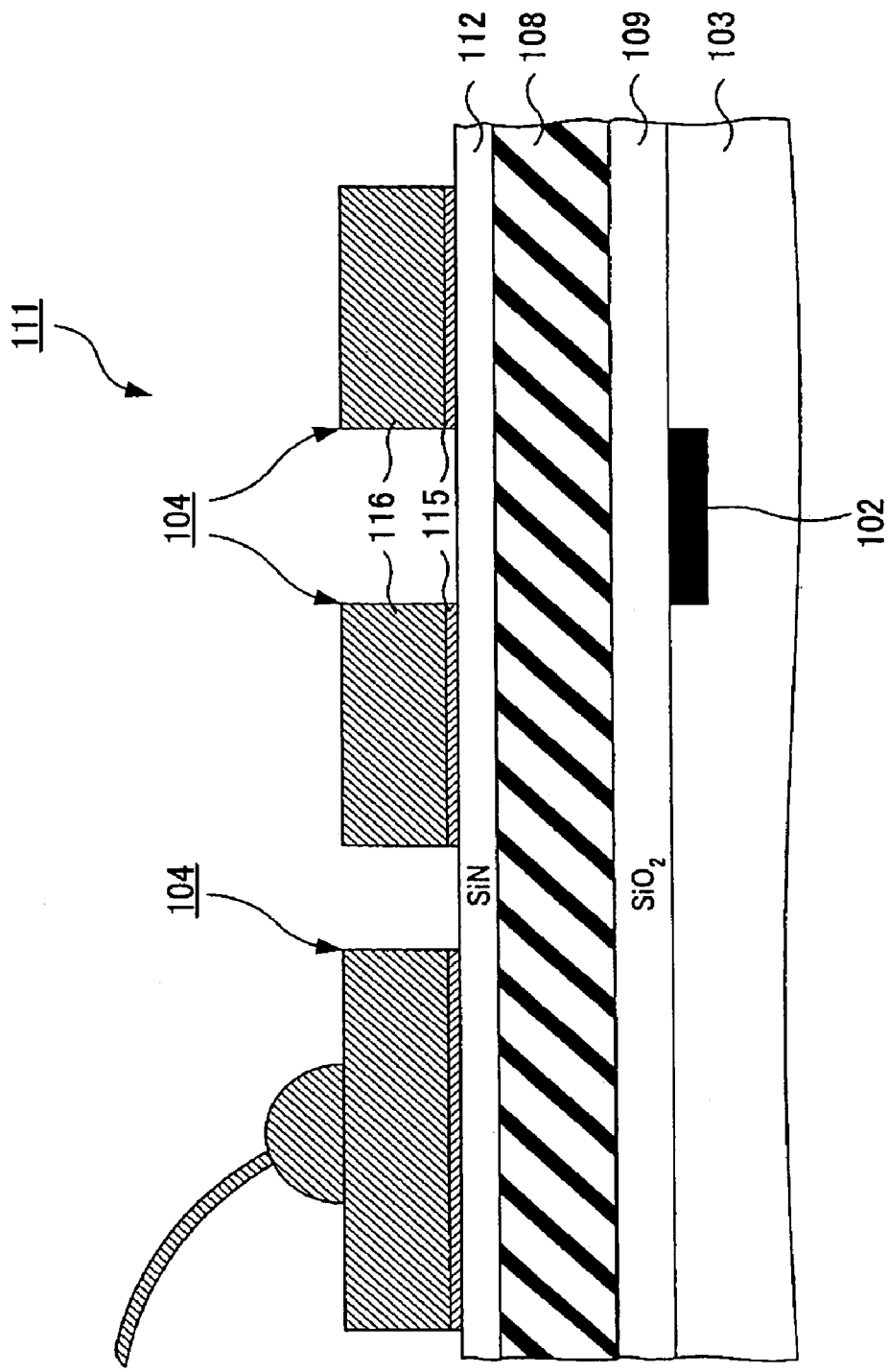
FIG. 3 is a sectional view of a semiconductor device having an adhesive layer.

FIG. 3 shows a sectional view of a semiconductor device 111 comprising as an adhesive layer an insulation film 112 made of a silicon material (for example, silicon nitride) between a wiring film 104 and an organic film 108.

By providing the insulation film (adhesive layer) 112 between the wiring layer 104 and the organic film 108, it is possible to preferably prevent separation of the wiring layer 104 in a wire bonding process or in a heating process. The insulation film 112 made of a silicon material has a moisture resistance property higher than that of the organic film 108. Also because of this high moisture resistance property, a high reliability is expected of the semiconductor device 111.

The semiconductor device 111 shown in FIG. 3 is manufactured in a manner described below.

First, a silicon oxide film 109, the organic film 108, and the adhesive layer 112 are sequentially stacked on a semiconductor base 103. Then, a thin metal film 115 which is formed by stacking a titanium film and a copper film is formed on the adhesive layer 112. The metal film 115 is a seed layer for forming a thick metal film 116 by a plating process. The wiring layer 104 is constituted by the thin metal film 115 and the thick metal film 116.

A resist film is formed on regions of the seed layer 115 other than regions where the wiring layer 104 is to be formed, exposing only the regions of the seed layer 115 where the wiring layer 104 is to be formed. The thick metal layer (plating layer) 116 made of copper is then formed on the regions of the seed layer 115 that are not covered with the resist film by a plating process. Lastly, the resist film and the seed layer 115 underneath the resist film are removed by etching. As a result, the semiconductor device 111 having the structure shown in FIG. 3 is achieved.

However, it is revealed that the semiconductor device 111 having the structure shown in FIG. 3 can not obtain such a high reliability (a high moisture resistance property) as expected.

In some case, according to the manufacturing method described above, the adhesive layer 112 beneath the seed layer 115 is also removed together when the seed layer 115 beneath the resist film is etched out. As described above, the adhesive layer 112 made of a silicon material has a high moisture resistance property. This means that the above-described manufacturing method might cause a state that a part of the organic film 108 is not covered with the adhesive layer 112 excellent in the moisture resistance property. Because of this, the moisture resistance property of the semiconductor device 111 is deteriorated, and the semiconductor device 111 therefore hardly achieves a high reliability.

A semiconductor device according to an embodiment of the present invention, which is protected from separation of the wiring layer and has a high moisture resistance property will now be explained below with reference to the drawings.

Figure 4:
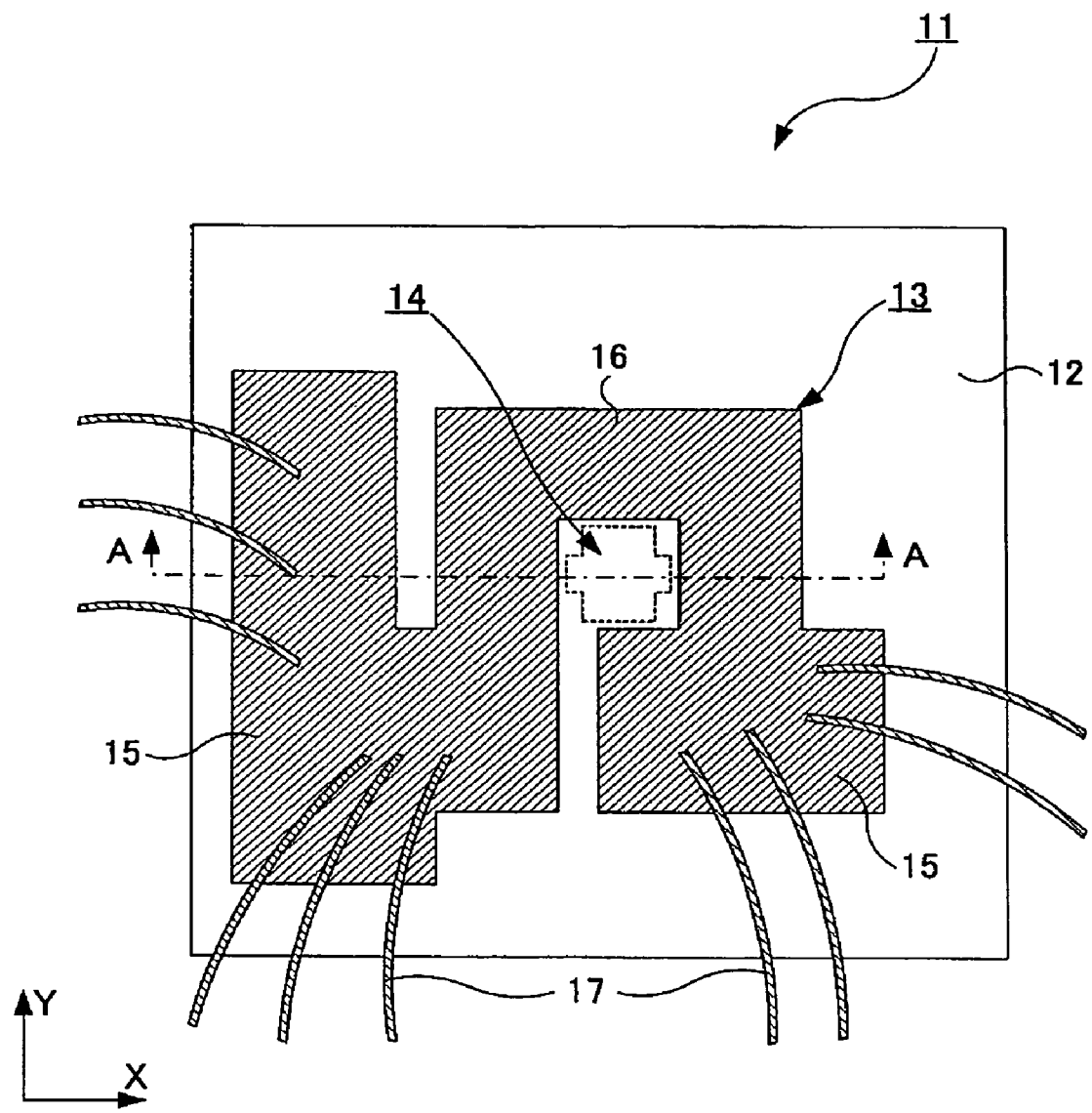
FIG. 4 is a top view of a semiconductor device according to an embodiment of the present invention.

FIG. 4 is a top view of a semiconductor device 11 according to an embodiment of the present invention.

As shown in FIG. 4, the semiconductor device 11 comprises a semiconductor base 12 and a wiring layer 13.

The semiconductor base 12 is constituted by a p-type silicon substrate which is formed by epitaxial growth. The silicon substrate is formed into, for example, an approximately square shape, and has a Hall element region 14 in the center thereof. Although not illustrated, a plurality of semiconductor circuit elements constituting an amplifier circuit, a detector circuit, etc. are integrated on the semiconductor base 12.

The wiring layer 13 is formed of a plate-like metal film which is patterned into a predetermined shape, and constitutes a path of a measurement target current. The wiring layer 13 comprises pad portions 15 and a U shape portion 16.

The pad portions 15 are arranged at both ends of the U shape portion 16, respectively. The pad portions 15 are connected to terminals or the like (not illustrated) of a lead frame on which a measurement target circuit is mounted, via wires 17 made of metal. For example, a current from the measurement target circuit flows from one pad portion 15 to the U shape portion 16, and further to the other pad portion 15 and finally returns to the measurement target circuit The U shape portion 16 is so provided as to surround at least partly the Hall element region 14 as viewed from the top. With a flow of a measurement target current through the U shape portion 16, a stable and strong magnetic field is formed near the inside of the U shape portion 16, i.e. the Hall element region 14. Because of this, highly sensitive and highly precise current detection (measurement) utilizing the Hall effect becomes available in the Hall element region 14, as will be described later.

Figure 5:
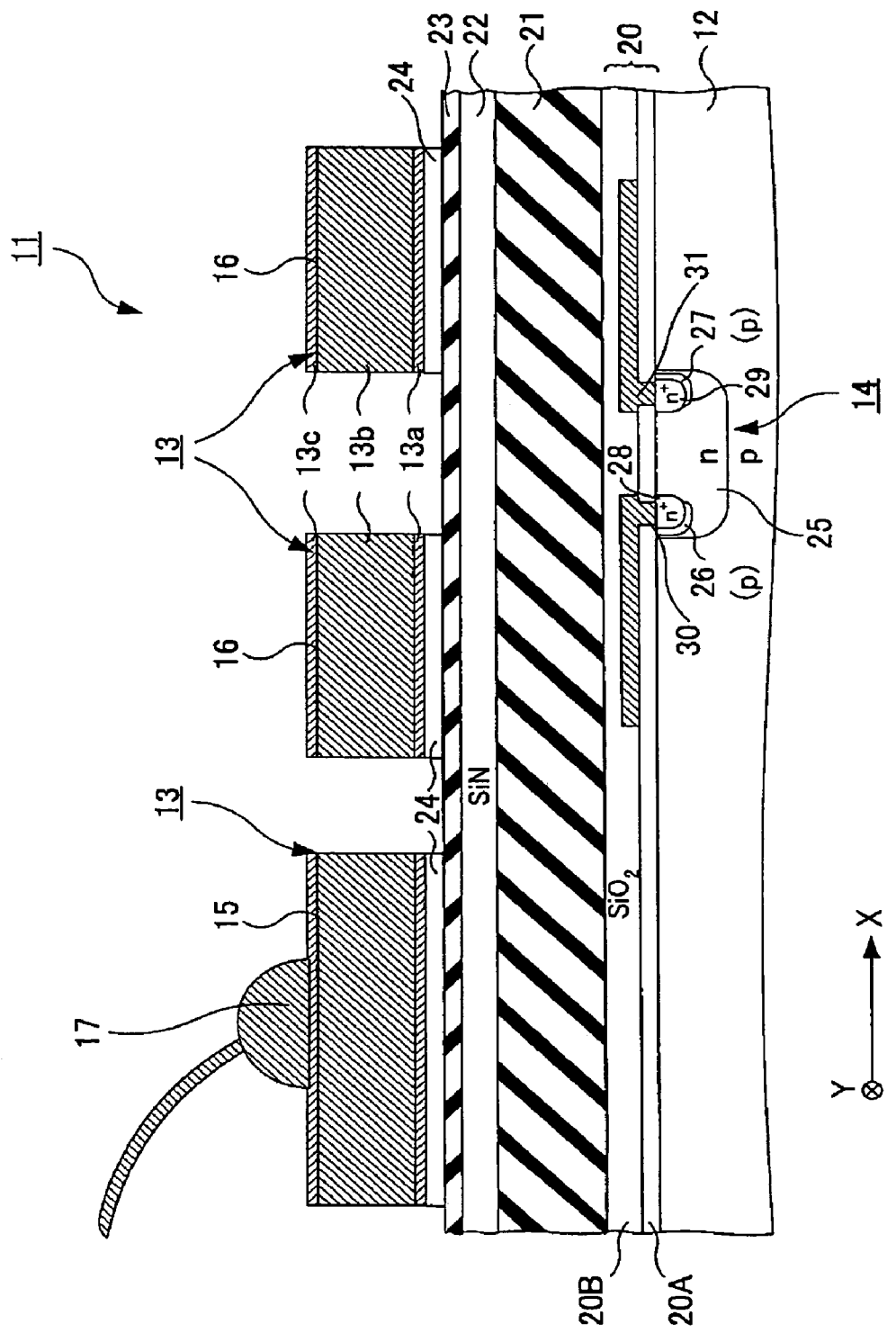
FIG. 5 is a sectional view of the semiconductor device shown in FIG. 4.

FIG. 5 shows a sectional view of the semiconductor device 11 as sectioned along a line A—A shown in FIG. 4. As shown in FIG. 5, the Hall element region 14 is provided in the surface area of the semiconductor base 12. A first insulation film 20, a first organic film 21, a second insulation film 22, a second organic film 23, a third insulation film 24 and a wiring layer 13 are sequentially stacked on the semiconductor base 12.

Figure 6:
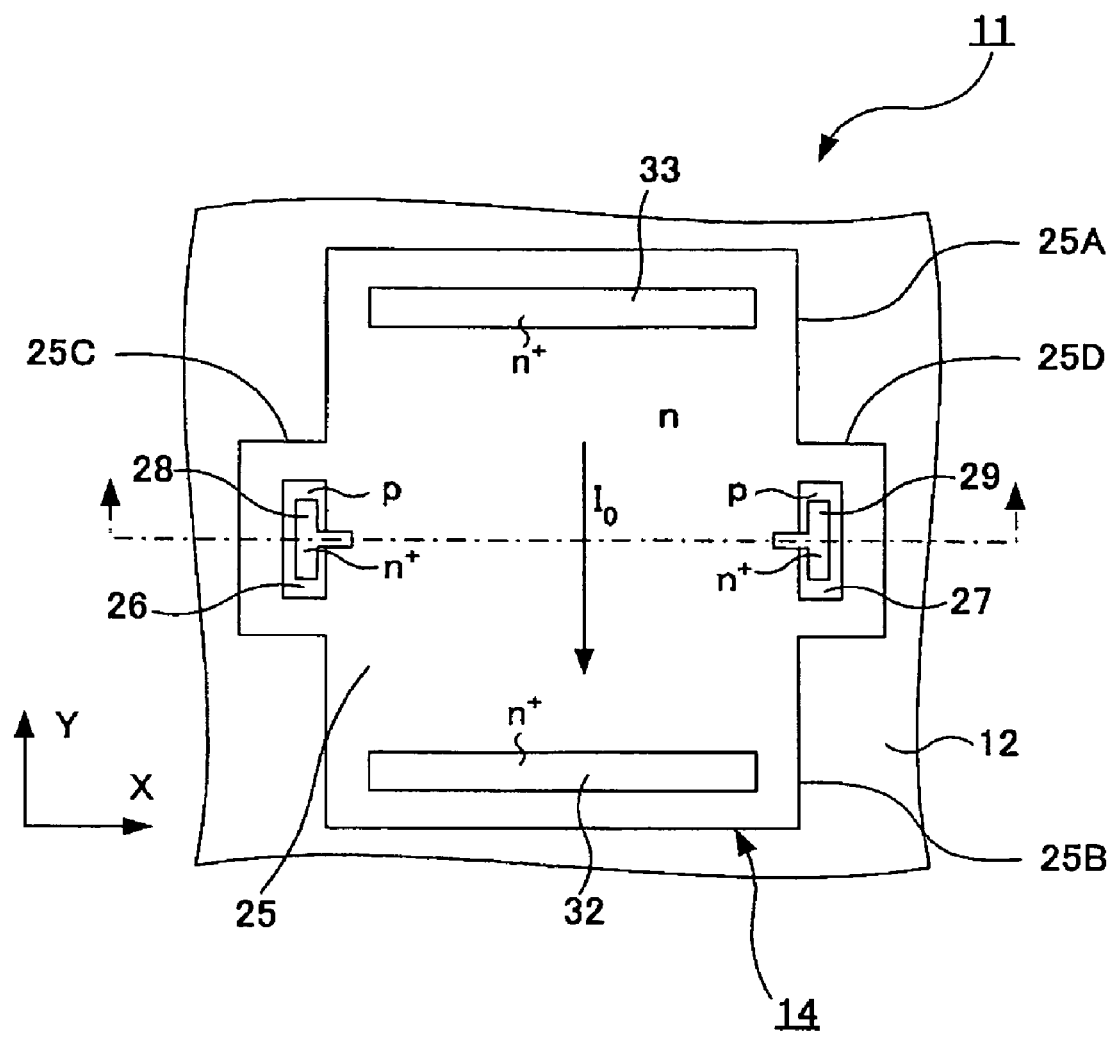
FIG. 6 is a top view of a Hall element region included in the semiconductor device shown in FIG. 4.

The Hall element region 14 is constituted by an n-type semiconductor region 25 which is formed in the surface area of the p-type semiconductor base 12 by impurity diffusion FIG. 6 is a top view showing the specific structure of the Hall element region 14. As shown in FIG. 6, the n-type semiconductor region 25 is formed into an approximately cross-shaped structure and comprises four branch portions 25A, 25B, 25C, and 25D extending in four different directions. The width of the branch portions 25A and 25B extending in a Y direction is larger than the width of the branch portions 25C and 25D extending in an X direction.

The branch portions 25C and 25D are provided respectively with a first and a second p-type semiconductor regions 26 and 27 which are opposed to each other. The first and second p-type semiconductor regions 26 and 27 are formed by selectively implanting a p-type impurity into the n-type semiconductor region 25.

A first and a second $n^+$-type semiconductor regions 28 and 29 whose impurity concentration is higher than that of the n-type semiconductor region 25 are formed in the first and second p-type semiconductor regions 26 and 27, respectively. As shown in FIG. 5 and FIG. 6, the first and second $n^+$-type semiconductor regions 28 and 29 have their respective parts of their surfaces opposed to each other protruding from the first and second p-type semiconductor regions 26 and 27 to contact the n-type semiconductor region 25. The contact areas of the first and second $n^+$-type semiconductor regions 28 and 29 and the n-type semiconductor region 25 are restricted by the first and second p-type semiconductor regions 26 and 27 surrounding the first and second $n^+$-type semiconductor regions 28 and 29.

Exposed surfaces of the first and second $n^+$-type semiconductor regions 28 and 29 make ohmic contact with a first and a second electrodes 30 and 31. The first and second electrodes 30 and 31 are connected to an unillustrated detector circuit.

On the other hand, the branch portions 25A and 25B extending in the Y direction are provided respectively with a third and a fourth $n^+$-type semiconductor regions 32 and 33 having an impurity concentration higher than that of the n-type semiconductor region 25 and so formed as to be opposed to each other. The third and fourth $n^+$-type semiconductor regions 32 and 33 are formed over almost the entire width of the branch portions 25A and 25B. The third and fourth $n^+$-type semiconductor regions 32 and 33 are formed by selectively implanting an n-type impurity on the n-type semiconductor region 25 having the same "n-type" characteristic.

Exposed surfaces of the third and fourth $n^+$-type semiconductor regions 32 and 33 are connected to unillustrated electrodes respectively, and further to an unillustrated current supply circuit via the electrodes. At the time of current detection, the current supply circuit supplies a current $I_0$. The supplied current $I_0$ flows through the n-type semiconductor region 25 between the third n+-type semiconductor region 32 and the fourth n+-type semiconductor region 33 in, for example, a direction indicated by an arrow in FIG. 6. The direction of flow of the current $I_0$ may be opposite.

As shown in FIG. 5, the first insulation film 20 is constituted by two insulation films 20A and 20B, and is formed on the semiconductor base 12. The insulation film 20A insulates the first and second electrodes 30 and 31 connected to the first and second n+-type semiconductor regions 28 and 29 from the semiconductor base 12. The insulation film 20B covers the first and second electrodes 30 and 31. The first insulation film 20 (insulation films 20A and 20B) is made of a silicon material such as silicon dioxide, for example. The first insulation film 20 is formed by CVD (Chemical Vapor Deposition) or the like so as to have an overall thickness of, for example, 2 µm.

The first organic film 21 is formed on the first insulation film 20. The first organic film 21 is made of polyimide resin, such as PIQ (Polyimide Isoindro Quinazolinedione, a registered trademark of Hitachi Chemical Co., Ltd.). The first organic film 21 is formed on the first insulation film 20 by spin-coating or the like, so as to have a thickness larger than that of the first insulation film 20, for example, a thickness of 5 µm.

The first insulation film 20 made of a silicon material well adheres to both of the semiconductor base 12 made of silicon and the first organic film 21 made of polyimide resin. Therefore, the first insulation film 20 serves as an adhesive layer for preventing separation of the semiconductor base 12 and the first organic film 21.

The first organic film 21 has a high withstand voltage. Because of this, by forming the first organic film 21 thick, a high withstand voltage can be obtained between the semiconductor base 12 and the wiring layer 13. Further, the first organic film 21 flattens the surface on which the wiring layer 13 is to be formed, and relieves an impact to be transmitted to the semiconductor base 12 in a wire bonding process by absorbing a stress applied to the pad portions 15 of the wiring layer 13.

The second insulation film 22 is formed on the first organic film 21. The second insulation film 22 is made of a silicon material such as silicon nitride, for example. The second insulation film 22 is formed by plasma CVD or the like, so as to have a smaller thickness than that of the first organic film 21, for example, a thickness of 0.5 µm.

The second insulation film 22 made of a silicon material is superior to the first organic film 21 made of an organic material in moisture resistance property. Therefore, it is possible to realize a high moisture resistance property by covering the first organic film 21 with the second insulation film 22, even if the first organic film 21 had some moisture absorption property.

The second organic film 23 is formed on the second insulation film 22. The second organic film 23 is made of the same material, and formed by the same method as the first organic film 21.

The second organic film 23 is provided for preventing the second insulation film 22 from being removed in an etching process which is performed in forming the wiring layer 13. By providing the second organic film 23, the first organic film 21 remains completely covered with the second insulation film 22 after the etching process. As a result, a high moisture resistance property can be maintained after the etching process.

The second organic film 23 is formed thinner than the first organic film 21. To be more specific, the second organic film 23 needs only to have a thickness that is sufficient for protecting the second insulation film 22 without fail in the etching process performed in forming the wiring layer 13. For example, the second organic film 23 has a thickness of approximately 1 µm.

The third insulation film 24 is made of silicon nitride, and provided between the wiring layer 13 and the second organic film 23. As illustrated, the third insulation film 24 has the same top view shape as that of the wiring layer 13. The bottom surface of the third insulation film 24 directly contacts the second organic film 23. The third insulation film 24 adheres well to both of the second organic film 23 made of an organic material and the wiring layer 13 made of metal. That is, the third insulation film 24 functions as an adhesive layer for preventing separation of the wiring layer 13 and the second organic film 23.

The third insulation film 24 is formed thinner than the first organic film 21. Specifically, the third insulation film 24 needs only to have a thickness sufficient for preventing separation of the wiring layer 13 and the second organic film 23 without fail. For example, the third insulation film 24 has a thickness of approximately 0.1 µm.

The wiring layer 13 is formed on the third insulation film 24. The wiring layer 13 is constituted by sequentially stacking a titanium/copper layer 13a, a copper-plated layer 13b, and a gold layer 13c.

The titanium/copper layer 13a is formed on the third insulation film 24 to have a thickness of, for example, 0.2 µm. The titanium/copper layer 13a is constituted by a stacked layer including a titanium film and a copper film which are formed by an electron beam evaporation method or the like. The titanium/copper layer 13a is a seed layer serving as a seed for growing the copper-plated layer 13b by a plating process.

The copper-plated layer 13b is formed on the titanium/copper layer 13a to have a thickness of, for example, 50 µm. The copper-plated layer 13b is formed by a plating process which utilizes the titanium/copper layer 13a as a seed layer.

The gold layer 13c is formed on the copper-plated layer 13b by a plating process or the like. The gold layer 13c has a thickness of, for example, 3 µm.

As described above, the third insulation film 24 made of silicon nitride serves as an adhesive layer for preventing separation of the wiring layer 13 and the second organic film 23.

Generally, an organic material and metal poorly adhere to each other. Therefore, if the wiring layer 13 is directly formed on the second organic film 23, the wiring layer and the second organic film 23 might be separated from each other in a wire bonding process and a heating process. However, the third insulation film 24 well adheres to both of the second organic film 23 made of an organic material and the wiring layer 13 made of metal. Accordingly, by providing the third insulation layer 24 between the wiring layer 13 and the second organic film 23, it is possible to prevent separation of the wiring layer 13 and the second organic film 23 in a wire bonding process and in a heating process.

As described above, the wiring layer 13 is formed such that the U shape portion 16 surrounds the Hall element region 14 as seen from the top. Further, as shown in FIG. 5, the U shape portion 16 of the wiring layer 13 exists above the Hall element region 14.

A measurement target current flowing through the wiring layer 13 is detected in a manner described below.

While the semiconductor device 11 works, a current $I_0$ supplied from an unillustrated current supply circuit flows through the n-type semiconductor region 25 between the first electrode 30 and the second electrode 31, as shown in FIG. 6. Note that in FIG. 5, the current $I_0$ flows in the direction perpendicular to the sheet.

Further, a measurement target current having a level of, for example, approximately 5A and supplied from an unillustrated measurement target circuit flows through the wiring layer 13.

When the measurement target current flows through the U shape portion 16 of the wiring layer 13, a stable and strong magnetic field is formed inside the U shape portion 16 as seen from the top, i.e. near the Hall element region 14. This magnetic field orthogonally crosses the current $I_0$ flowing through the n-type semiconductor region 25 of the Hall element region 14. Accordingly, a Lorentz force acts on the electrons of the Hall element region 14 (n-type semiconductor region 25) in a direction orthogonal to both of the magnetic field and the current $I_0$. Such a so-called Hall effect causes a potential difference (Hall voltage) between the first $n^+$-type semiconductor region 28 and the second $n^+$-type semiconductor region 29 formed in the branch portions 25C and 25D of the n-type semiconductor region 25.

The caused potential difference is detected by an unillustrated detector circuit which is connected to the first and second $n^+$-type semiconductor regions 28 and 29 via the first and second electrodes 30 and 31. The detector circuit finds out whether there flows any measurement target current, and if any, obtains the level of the measurement target current based on the detected potential difference. The obtained data is supplied, for example, to the measurement target circuit as feedback data.

EXAMPLE

The above-described semiconductor device 11 was manufactured in the manner described below, and its interconnection strength (share strength) after it was subjected to a wire bonding process was measured. The measurement result will also be shown below.

Figure 7A:
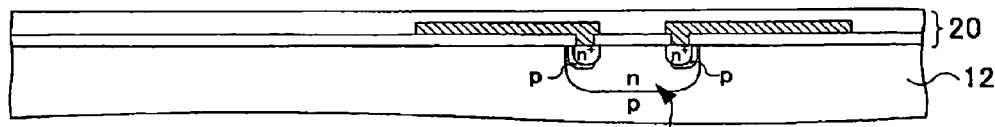
FIG. 7A to FIG. 7D are diagrams showing manufacturing steps of the semiconductor device shown in FIG. 4.
Figure 7B:
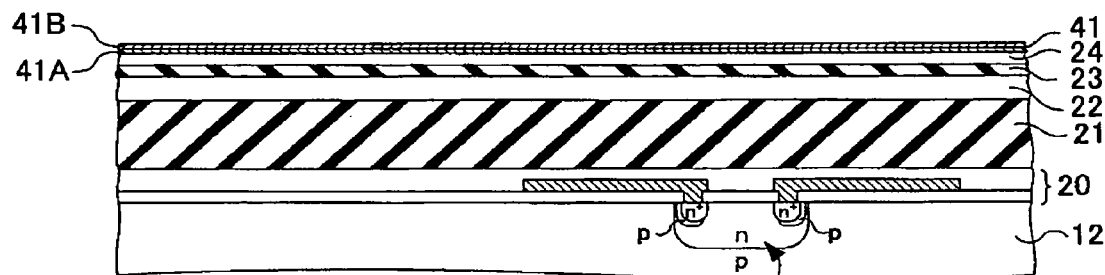

First, as shown in FIG. 7A, the semiconductor base 12 is prepared which has the Hall element region 14 (Hall element), etc. formed in its surface area and whose surface is covered with the first insulation film 20. Next, as shown in FIG. 7B, a PIQ film to constitute the first organic film 21 is formed on the first insulation film 20 by spin-coating. Then, a silicon nitride film to constitute the second insulation film 22 is formed on the first organic film 21 by plasma CVD.

A PIQ film to constitute the second organic film 23 is formed on the second insulation film 22 by spin-coating. Further, a silicon nitride film to constitute the third insulation film 24 is formed on the second organic film 23 by plasma CVD. Then, a titanium layer 41A and a copper layer 41B are sequentially formed on the third insulation film 24 by an electron beam evaporation method. The above-described titanium/copper layer (seed layer) 13a is obtained by patterning the titanium layer 41A and the copper layer 41B into a predetermined shape.

Figure 7C:
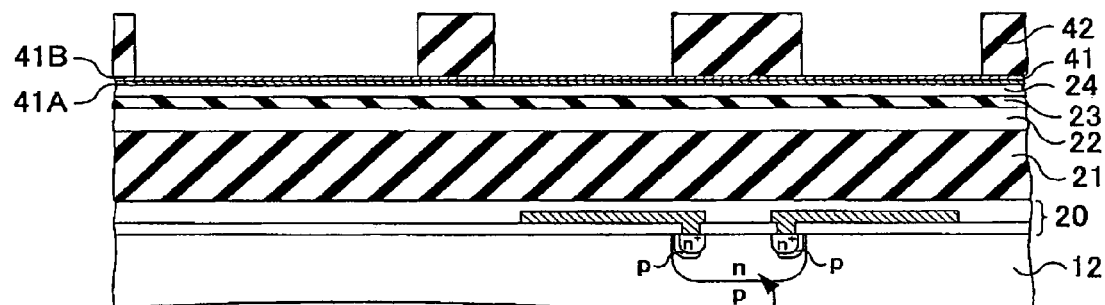

Then, as shown in FIG. 7C, a photoresist film 42 having a predetermined pattern is formed on the copper layer 41B. The areas on which the photoresist film 42 is not formed substantially correspond to the areas on which the wiring layer 13 is to be formed.

Figure 7D:
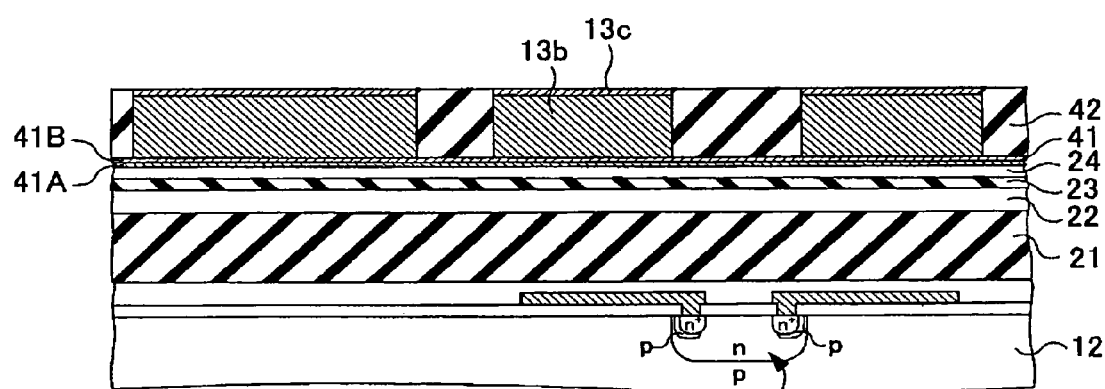

Then, as shown in FIG. 7D, the copper-plated layer 13b is formed on the copper layer 41B by a copper plating process. The gold layer 13C is then formed on the copper-plated layer 13b by a gold plating process.

Afterwards, the photoresist film 42, and the titanium layer 41A, the copper layer 41B, and the third insulation film 24 beneath the photoresist film 42 are removed by etching. As a result, the semiconductor device 11 having the structure shown in FIG. 5 is completed.

Note that the semiconductor device 111 having the structure shown in FIG. 3 can be manufactured by omitting the process of forming the second organic film 23 and the third insulation film 24 from the manufacturing method for the semiconductor device 11 described above.

As described above, the second organic film 23 is formed on the second insulation film 22. This prevents the second insulation film 22 from being damaged when the photoresist film 42, the titanium layer 41A, the copper layer 41B, and the third insulation film 24 are etched, enabling realization of a high moisture resistance property of the semiconductor device 11. Further, since the thick first organic film 21 is formed between the semiconductor base 12 and the wiring layer 13, a high withstand voltage can be achieved in the semiconductor device 11. Accordingly, it is possible to realize a high reliability of the semiconductor device 11.

Next, the wires 17 were connected to the pad portions 15 of the wiring layer 13 by wire bonding, and the share strength of the wires 17 was tested. Note that measurement of share strength was conducted on the semiconductor device 11 which was manufactured in the above-described manner, and on a semiconductor device in which a wiring layer is directly formed on an organic film (i.e. a semiconductor device which does not comprise the above-described third insulation film 24 or a semiconductor device which does not comprise the second insulation film 22, the second organic film 23, and the third insulation film 24 described above).

The share strength of the semiconductor device 11 manufactured in the above-described manner was approximately 16.7N (1700 gf). On the other hand, the share strength of the semiconductor device in which a wiring layer is directly formed on an organic film was approximately 5.88N (600 gf).

It is obvious from these measurement results that a share strength can be obtained which is approximately three times as large as that obtained in a case where a wiring layer is directly formed on an organic film, by providing the second insulation film 22 and third insulation film 24 which function as adhesive layers.

As explained above, since the semiconductor device 11 comprises the second insulation film 22 which functions as an adhesive layer between the first organic film 21 and the second organic film 23, and the third insulation film 24 which functions as an adhesive layer between the second organic film 23 and the wiring layer 13, the wiring layer 13 can be prevented from being separated in a wire bonding process and in a heating process. Therefore, it is possible to achieve the semiconductor device 11 having a high reliability.

Since the semiconductor device 11 comprises the thick first organic film 21, it is possible to relieve the impact to be applied in the wire bonding process and to achieve a high withstand voltage in the semiconductor device 11.

Further, since the semiconductor device 11 comprises the second organic film 23 for protecting the second insulation film 22, the first organic film 21 having a high moisture absorption property is securely covered with the second insulation film 22 having a high moisture resistance property even after an etching process is performed. This makes it possible to achieve the semiconductor device 11 having a high moisture resistance property and thus a high reliability.

In the above-described embodiment, the second insulation film 22 and third insulation film 24 functioning as adhesive layers are made of silicon nitride. However, the second insulation film 22 and the third insulation film 24 may be made of other silicon materials, for example, silicon dioxide or silicon oxide nitride. However, it is preferred that the second insulation film 22 be made of silicon nitride, in order to achieve a high moisture resistance property (waterproofness).

In the above-described embodiment, the first organic film 21 and the second organic film 23 are made of polyimide resin. However, the first organic film 21 and the second organic film 23 may be made of other organic insulation materials.

A shield layer for restricting noise may be provided between the first organic film 21 and the semiconductor base 12 in order to restrict noise.

Figure 8:
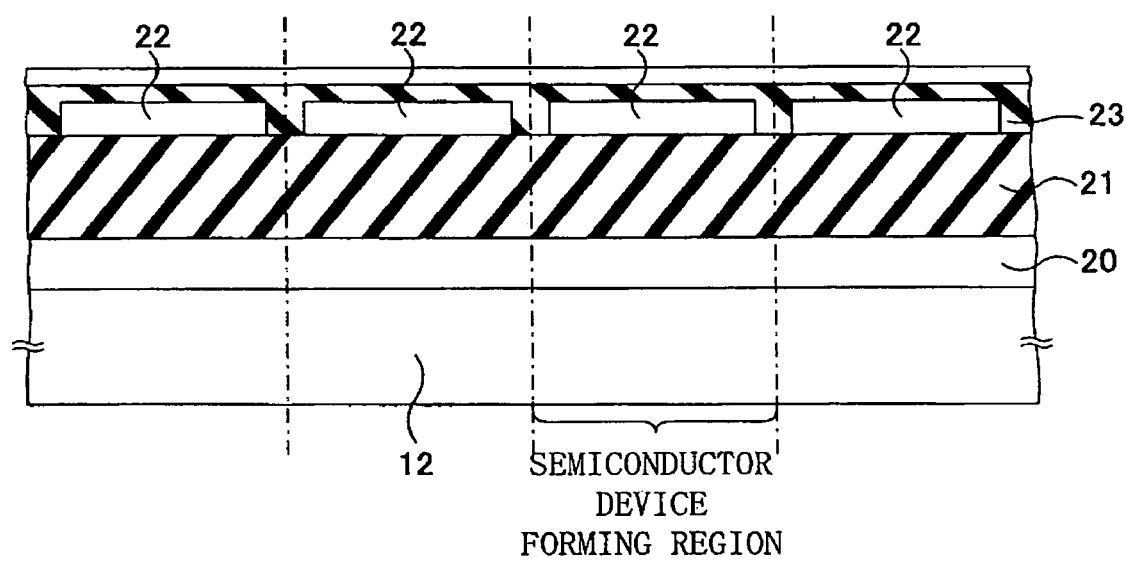
FIG. 8 is a diagram showing an alternative method of manufacturing the semiconductor device according to the embodiment of the present invention.

A crack is easily caused in the silicon nitride film constituting the second insulation film 22, due to a difference in coefficient of linear expansion from other films. Therefore, in order to manufacture a plurality of semiconductor devices 11 out of a semiconductor wafer, the second insulation film 22 may not be formed all over the entire surface of the semiconductor wafer, but may be formed separately in each region in which the semiconductor device 11 is to be formed, as shown in FIG. 8.

Figure 9:
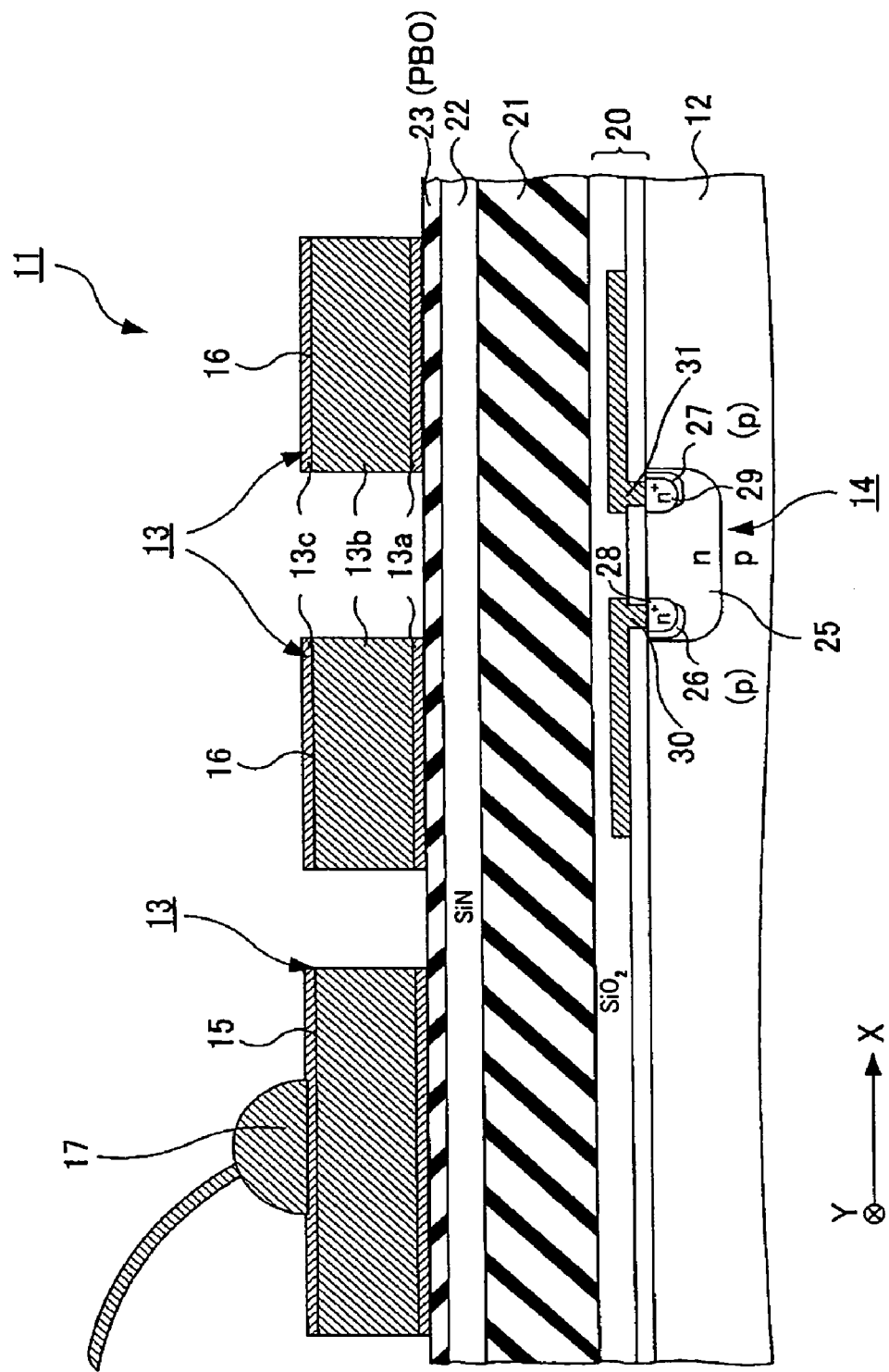
FIG. 9 is a diagram showing another structure of the semiconductor device according to the embodiment of the present invention.

The third insulation film 24 described above may be omitted. In this case, the second organic film 23 may be made of polybenzoxazole (PBO) resin, as shown in FIG. 9. PBO resin is excellent in moisture resistance property and has a strong adhesiveness to a metal film The semiconductor device 11 having the structure shown in FIG. 9 can be manufactured by omitting the process of forming the third insulation film 24 from the manufacturing method for the semiconductor device 11 having the structure shown in FIG. 4.

The second insulation film 22 and third insulation film 24 described above may be constituted by a plurality of films. For example, the second insulation film 22 and the third insulation film 24 may be constituted by stacking a silicon nitride film and a silicon oxide film.

In the above-described embodiment, the case where the wiring layer 13 is constituted by the pad portions 15 and the U shape portion 16 is explained as an example. However, the wiring layer 13 may constitute either the pad portions 15 or the U shape portion 16. In other words, the pad portions 15 functioning as metal pads to which the wires 17 are connected, and the U shape portion 16 functioning as a wiring (metal wire) through which a measurement target current flows, may be constituted by wiring layers 13 different from each other. In this case, the pad portions 15 and the U shape portion 16 may be connected to each other by, for example, a bonding wire. Or, the U shape portion 16 may be formed in a layer under the pad portions 15, and the both may be connected to each other via, for example, a contact hole. These are also applicable to the wiring layer 104 shown in the embodiment.

Further, in the explanation so far, the semiconductor device 11 for detecting (measuring) a current by utilizing a Hall effect was described as an example. However, the present invention can be applied to any semiconductor device if it has a structure obtained by stacking an organic film made of an organic insulation material and a metal film made of metal. For example, the present invention can be applied to a semiconductor device having a power element or the like, and to a multilayer printed circuit board having a pad on its surface.

Various embodiments and changes may be made thereunto without departing from the broad spirit and scope of the invention. The above-described embodiment is intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the resent invention.

This application is based on Japanese Patent Application No. 2002-351740 filed on Dec. 3, 2002 and including specification, claims, drawings and summary. The disclosure of the above Japanese Patent Application is incorporated herein by reference in its entirety.

What is claimed is:

1. A semiconductor device comprising:
   a semiconductor base;
   a first insulation film which is provided on said semiconductor base and is made of a silicon material;
   a second insulation film which is provided on said first insulation film, is made of an organic material, and is thicker than said first insulation film;
   a third insulation film which is provided on said second insulation film, is made of a silicon material, and is thinner than said second insulation film;
   a metal layer which is grown on a seed layer which is provided via said third insulation film, and forms a wiring layer with said seed layer, wherein a current flows between said wiring layer and an external terminal; and
   wherein said wiring layer is formed, via a fourth insulation film which is provided between said third insulation film and the wiring layer, on a fifth insulation film which is provided on said fourth insulation film and formed so as to match a shape of said wiring layer.

2. The semiconductor device according to claim 1, wherein said fourth insulation film covers an entire surface of said third insulation film, and is made of an organic material.

3. The semiconductor device according to claim 2, wherein said fifth insulation film is made of a silicon material.

4. The semiconductor device according to claim 3, wherein said fifth insulation film has a top view shape same as that of said wiring layer.

5. The semiconductor device according to claim 1, wherein said wiring layer is made of metal.

6. The semiconductor device according to claim 5, wherein said wiring layer constitutes a metal pad which is connected to said external terminal, and/or a metal wire through which the current flows via said metal pad.

7. A semiconductor device comprising:
   a semiconductor base;
   a first insulation film which is provided on said semiconductor base;
   a second insulation film which is provided on said first insulation film and is thicker than said first insulation film;
   a third insulation film which is provided on said second insulation film and is made of a material having a moisture resistance property; and
   a metal layer which is grown on a seed layer which is provided via said third insulation film, and forms a wiring layer with said seed layer, wherein a current flows between said wiring layer and an external terminal,
   wherein said wiring layer is formed, via a fourth insulation film which is provided between said third insulation film and the wiring layer, on a fifth insulation film which is provided on said fourth insulation film and formed so as to match a shape of said wiring layer.

8. The semiconductor device according to claim 7, wherein said fourth insulation film covers an entire surface of said third insulation film in order to prevent said third insulation film from being damaged.

9. The semiconductor device according to claim 8, wherein said fifth insulation film functions as an adhesive layer for preventing separation of said wiring layer.

10. The semiconductor device according to claim 9, wherein said fifth insulation film has a top view shape same as that of said wiring layer.

11. The semiconductor device according to claim 8, wherein said fourth insulation film functions as an adhesive layer for preventing separation of said wiring layer.

12. The semiconductor device according to claim 7, wherein said wiring layer is made of metal.

13. The semiconductor device according to claim 12, wherein said wiring layer constitutes a metal pad which is connected to said external terminal, and/or a metal wire through which the current flows via said metal pad.

14. A semiconductor device comprising:
a semiconductor base;
a first insulation film which is provided on said semiconductor base and is made of a silicon material;
a second insulation film which is provided on said first insulation film, is made of an organic material, and is thicker than said first insulation film;
a third insulation film which is provided on said second insulation film, is made of an adhesive silicon material, and is thinner than said second insulation film; and
a wiring layer which is provided via said third insulation film;
a fourth insulation film being provided between said third insulating film and said wiring layer, said wiring layer being prevented from separation aver an entire region of the semiconductor device by an appropriate adhesion of a fifth insulation film which is provided on said fourth insulation film and formed so as to match a shape of said wiring layer, and wherein a current flows between said wiring layer and an external terminal.

15. A semiconductor device comprising:
a semiconductor base;
a first insulation film which is provided on said semiconductor base and is made of a silicon material;
a second insulation film which is provided on said first insulation film, is made of an organic material, and is thicker than said first insulation film;
a third insulation film which is provided on said second insulation film, is made of silicon material, and is thinner than said second insulation film; and
a metal layer which is patterned to form a wiring layer via said third insulation film, wherein a current flows between said wiring layers and an external terminal,
a fourth insulation film being provided between said third insulation flint and said wiring layer, and said wiring layer is formed on a fifth insulation film which is provided on said fourth insulation film and formed together wit the patterning of said metal layer so as to match a shape of said wiring layer.

* * * * *